United States Patent
McSorley et al.

(10) Patent No.: US 8,153,893 B2
(45) Date of Patent: Apr. 10, 2012

(54) VERTICAL PATCHING SYSTEM

(75) Inventors: Darren McSorley, Hong Kong (CN); Randy J. Below, Cheshire, CT (US); Peter Thickett, Bucks (GB); Michael Boisseau, Woodbury, CT (US); Lyle Menard, Meriden, CT (US)

(73) Assignee: The Siemon Company, Watertown, CT (US)

( * ) Notice: Subject to any disclaimer, the term of this patent is extended or adjusted under 35 U.S.C. 154(b) by 668 days.

(21) Appl. No.: 12/261,162

(22) Filed: Oct. 30, 2008

(65) Prior Publication Data
US 2009/0147944 A1    Jun. 11, 2009

Related U.S. Application Data

(60) Provisional application No. 60/983,634, filed on Oct. 30, 2007.

(51) Int. Cl.
    *H02G 3/08* (2006.01)
(52) U.S. Cl. ......... 174/50; 174/520; 174/59; 312/223.1; 312/223.2; 361/600; 361/679.1; 361/724; 379/454; 385/135
(58) Field of Classification Search ........... 174/50, 174/520, 17 R, 59; 361/600, 601, 724, 730, 361/752, 796, 797, 729, 826, 679.1; 211/26; 312/223.6, 223.1, 223.2, 351.1, 265.1, 265.2, 312/265.3, 294, 326, 329; 379/454; 385/134, 385/135

See application file for complete search history.

(56) References Cited

U.S. PATENT DOCUMENTS

| | | | |
|---|---|---|---|
| 6,605,782 B1 * | 8/2003 | Krietzman et al. | 211/26 |
| 6,945,616 B2 * | 9/2005 | Webster et al. | 312/265.3 |
| 7,437,048 B2 * | 10/2008 | Farrell et al. | 385/135 |
| 7,772,489 B2 | 8/2010 | Adducci et al. | |
| 7,781,675 B2 * | 8/2010 | Adducci et al. | 174/50 |
| 7,795,532 B2 * | 9/2010 | Walker | 174/50 |
| 7,816,602 B2 * | 10/2010 | Landry et al. | 174/50 |
| 7,880,084 B2 | 2/2011 | Adducci et al. | |
| 7,893,356 B2 * | 2/2011 | Garza et al. | 361/826 |
| 2003/0096536 A1 | 5/2003 | Clark et al. | |
| 2005/0002633 A1 | 1/2005 | Solheid et al. | |
| 2005/0265013 A1 | 12/2005 | Keith et al. | |
| 2006/0082263 A1 | 4/2006 | Rimler et al. | |
| 2006/0154513 A1 | 7/2006 | Barker et al. | |
| 2006/0228087 A1 | 10/2006 | Bayazit et al. | |
| 2007/0210686 A1 | 9/2007 | Adducci et al. | |

FOREIGN PATENT DOCUMENTS

EP    1603345 A2    12/2005
GB    2420665 A    5/2006

OTHER PUBLICATIONS

Supplementary European Search Report for International Application No. PCT/US2008081678, Jan. 13, 2011, 6 pages.
International Search Report, PCT/US 08/81678, Jan. 6, 2009.

* cited by examiner

*Primary Examiner* — Angel R Estrada
(74) *Attorney, Agent, or Firm* — Cantor Colburn LLP

(57) ABSTRACT

A patching system includes network equipment in a cabinet; a first patch panel cabinet; a second patch panel cabinet; a vertical patch panel mounted between the first patch panel cabinet and the second patch panel cabinet, the vertical patch panel having telecommunications connectors mounted therein; and a vertical cable manager mounted adjacent to one of the first patch panel cabinet and the second patch panel cabinet.

11 Claims, 6 Drawing Sheets

VERTICAL PATCHING SYSTEM

CROSS REFERENCE TO RELATED APPLICATIONS

This application claims the benefit of U.S. provisional patent application Ser. No. 60/983,634, filed Oct. 30, 2007, the entire contents of which are incorporated herein by reference.

BACKGROUND

Embodiments relate to rack and cabinet systems for mounting patch panels and active equipment. Patch panels or cross-connect products provide a centralized point for connecting voice and/or data lines to active equipment. Patch panels include a plurality of energy transmission connectors, e.g., electrical connectors and/or fiber optic cable connectors. Patch panels are commonly located in confined, relatively remote areas, such as termination closets. Installers generally perform wire terminations with little room to maneuver patch panels or themselves. Therefore, patch panel assemblies must be compact to save space, and to facilitate installer access to each patch panel.

High connector density from active equipment such as switches and servers or patch panels is used to allow the maximum quantity of connectors in a limited rack, cabinet or closet space. Relatively large numbers of connectors and cables or patch cords within a limited space requires efficient use of the space without undue complexity and without undue restriction on the ability to make and break the connections.

Most patch panels are mounted on either a rack, in a cabinet or on a wall mount bracket and require rear access. When individual conductors are to be coupled to the insulation displacement contacts on the jacks or connectors, the limited space available when the patch panels are mounted in a rack or cabinet makes maintenance difficult. Also, conventional bracket mounted patch panels cannot be densely stacked and provide limited patch panel access. Additionally, cable access to conventional mounted brackets occurs through the top or bottom of the bracket to prohibit stacking. Thus, there is a need for improved patching systems.

SUMMARY

Embodiments of the invention include a patching system including network equipment in a cabinet; a first patch panel cabinet; a second patch panel cabinet; a vertical patch panel mounted between the first patch panel cabinet and the second patch panel cabinet, the vertical patch panel having telecommunications connectors mounted therein; and a vertical cable manager mounted adjacent to one of the first patch panel cabinet and the second patch panel cabinet.

DETAILED DESCRIPTION

Cable management solutions have been available within the Information and Communications Technology (ICT) sector for a number of years. To date, cable management solutions have been designed for patch cord management either in an open rack design or singularly within a four post fully enclosed equipment cabinet. Embodiments of the invention go beyond this simplistic approach and define a solution that supports storage and network enterprise equipment.

Security within ICT spaces is becoming increasing important especially with the advent of co-location areas where multiple parties have access to the space, however a secure environment is required for the enterprise equipment. Embodiments of the invention address this issue.

The fundamental reasoning behind embodiments of the invention is that both rack mounted server/storage equipment and network equipment have fundamentally different ways in dealing with patch cord management and as such the solution for each is different. It is this fundamental difference that embodiments of the invention seek to solve and is the reason why a holistic approach is used when considering this solution.

There are three fundamental locations where enterprise solutions are used within data centers and ICT spaces as defined within ANSI/TIA-942-2005, these are Main Distribution Area (MDA), Horizontal Distribution Area (HDA) and Equipment Distribution Area (EDA). Each of these areas has different challenges for management of patch cords and embodiments of the invention are able to uniquely address the specific requirements for patch cord management within these areas. Embodiments of the invention include elements as follows: a vertical patch panel, integrated vertical cable manager and recessed cable zone as described in further detail herein.

Figure 1:
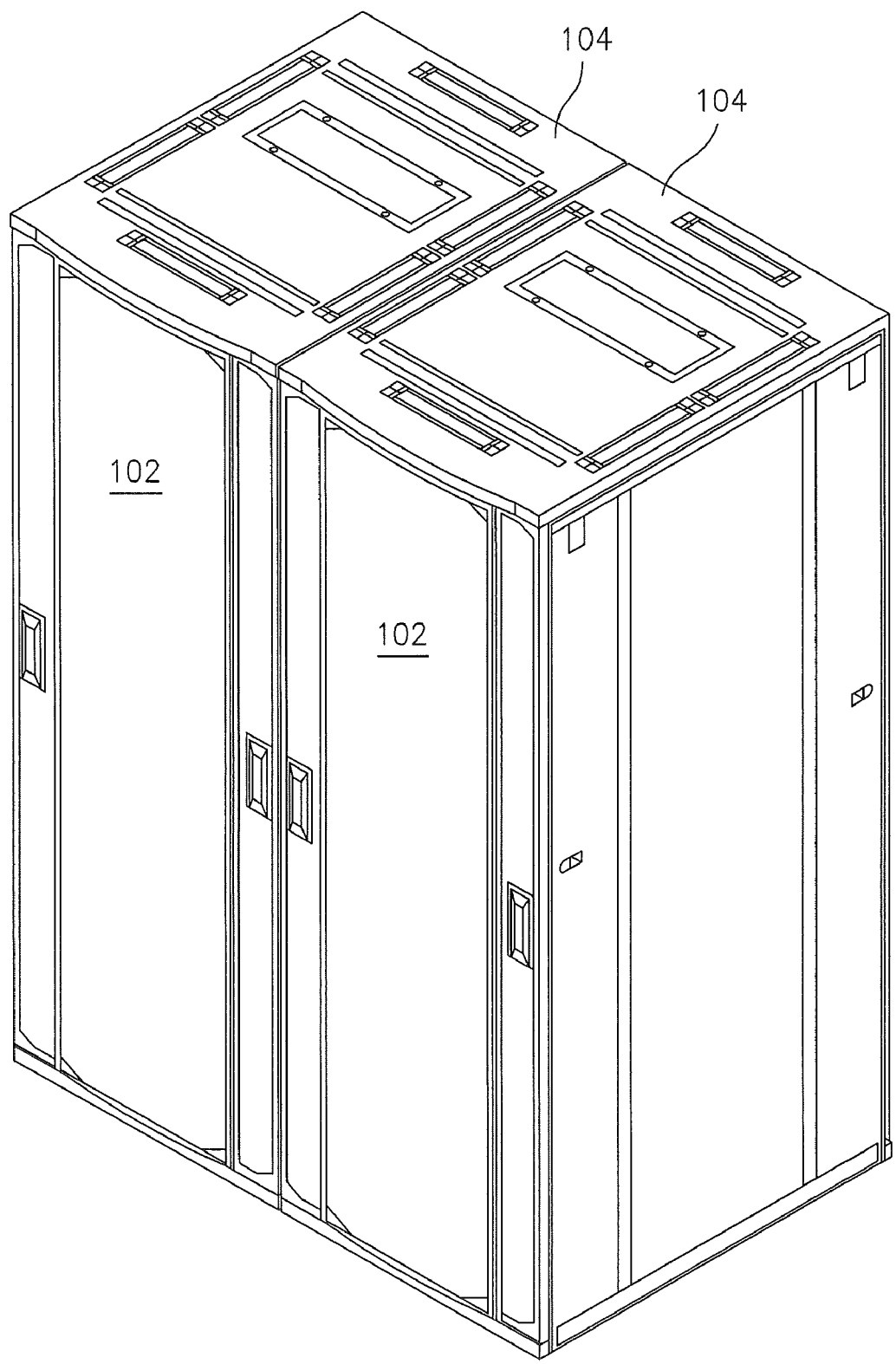
FIG. 1 is a perspective view of two cabinets in exemplary embodiments.

FIG. 1 is a perspective view of two cabinets 104 in exemplary embodiments. Cabinets 104 may contain a variety of telecommunications equipment such as patch panels, active equipment, etc. Each cabinet has a front door 102 shown closed in FIG. 1. As described in further detail herein, a variety of vertical elements may be positioned between two cabinets 104. These vertical elements include vertical patch panels, vertical cable managers and vertical power distribution panels.

Figure 2:
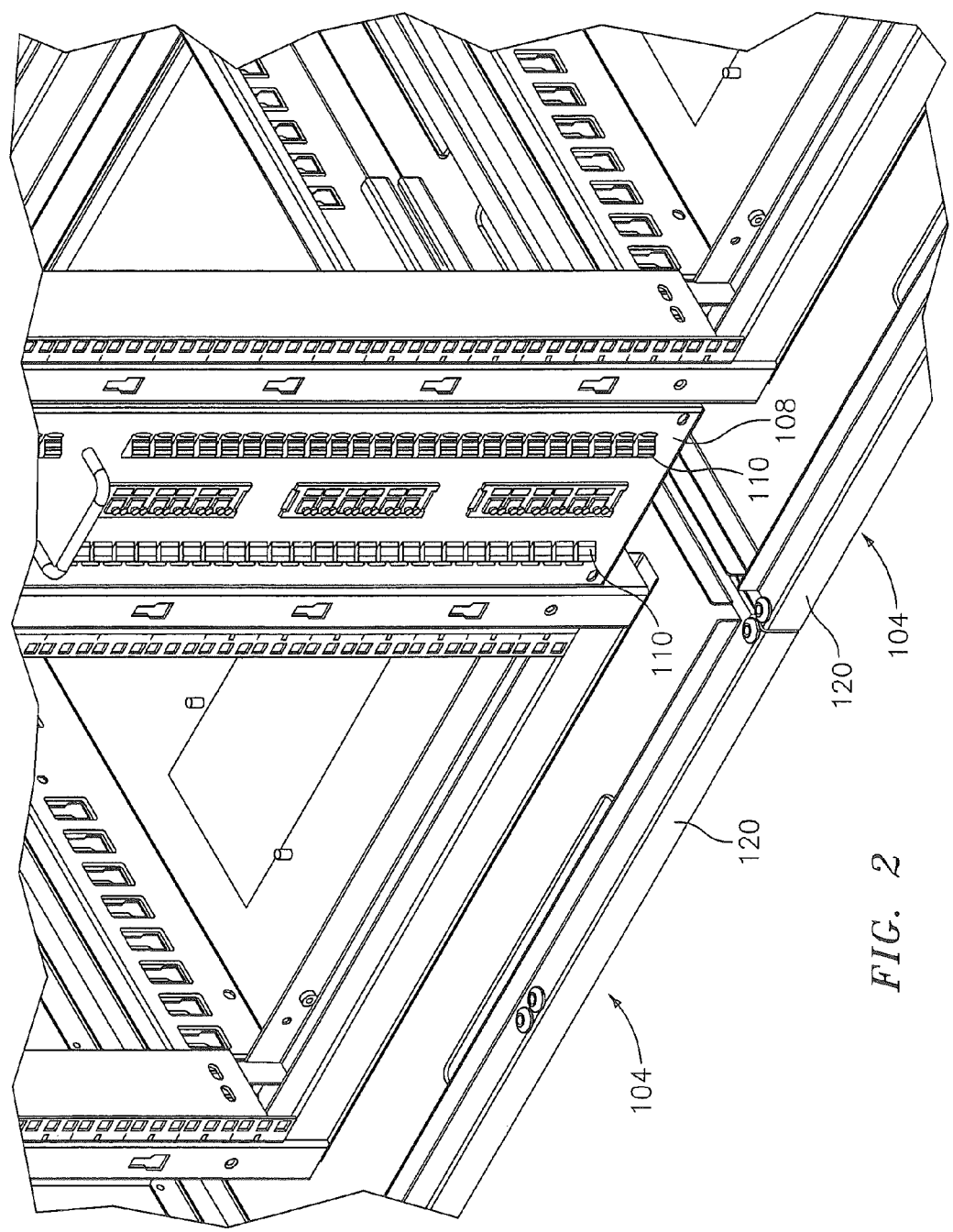
FIG. 2 is a perspective view of a vertical patch panel mounted between two cabinets.

FIG. 2 is a perspective view of a vertical patch panel 108 mounted between two cabinets 104, with doors 102 removed. The vertical patch panels 108 include openings that receive a variety of connectors, both copper and fiber. As shown in FIG. 2, the vertical patch panel 108 is fitted with a plurality of copper (e.g., RJ-45) and fiber connectors. As shown in FIG. 2, the vertical patch panel 108 is recessed relative to the front face of the cabinet rack frame 120. This recess provides an area where cables (e.g., copper, fiber, coax, etc.) may be placed whilst still located behind the closed door 102. The vertical patch panel 108 includes copper connectors 110 positioned on either side of fiber connectors 112. It is understood that other arrangements of connectors may be used in embodiments of the invention. The copper connectors 110 are angled such that copper connectors on the left side of the vertical patch panel 108 are angle left and copper connectors on the right side of the vertical patch panel 108 are angled right. It is understood that any type of connector may be angled and embodiments are not limited to copper connectors.

The vertical patch panel 108 is customized for the space between two cabinets 104 allowing for port identification and outlet orientation to be properly aligned for the end-user. Additional benefits include removal of cable from the server cabinet space to the space between cabinets. This promotes improved airflow within the cabinet for cooling and allows for greater active equipment density.

Figure 3:
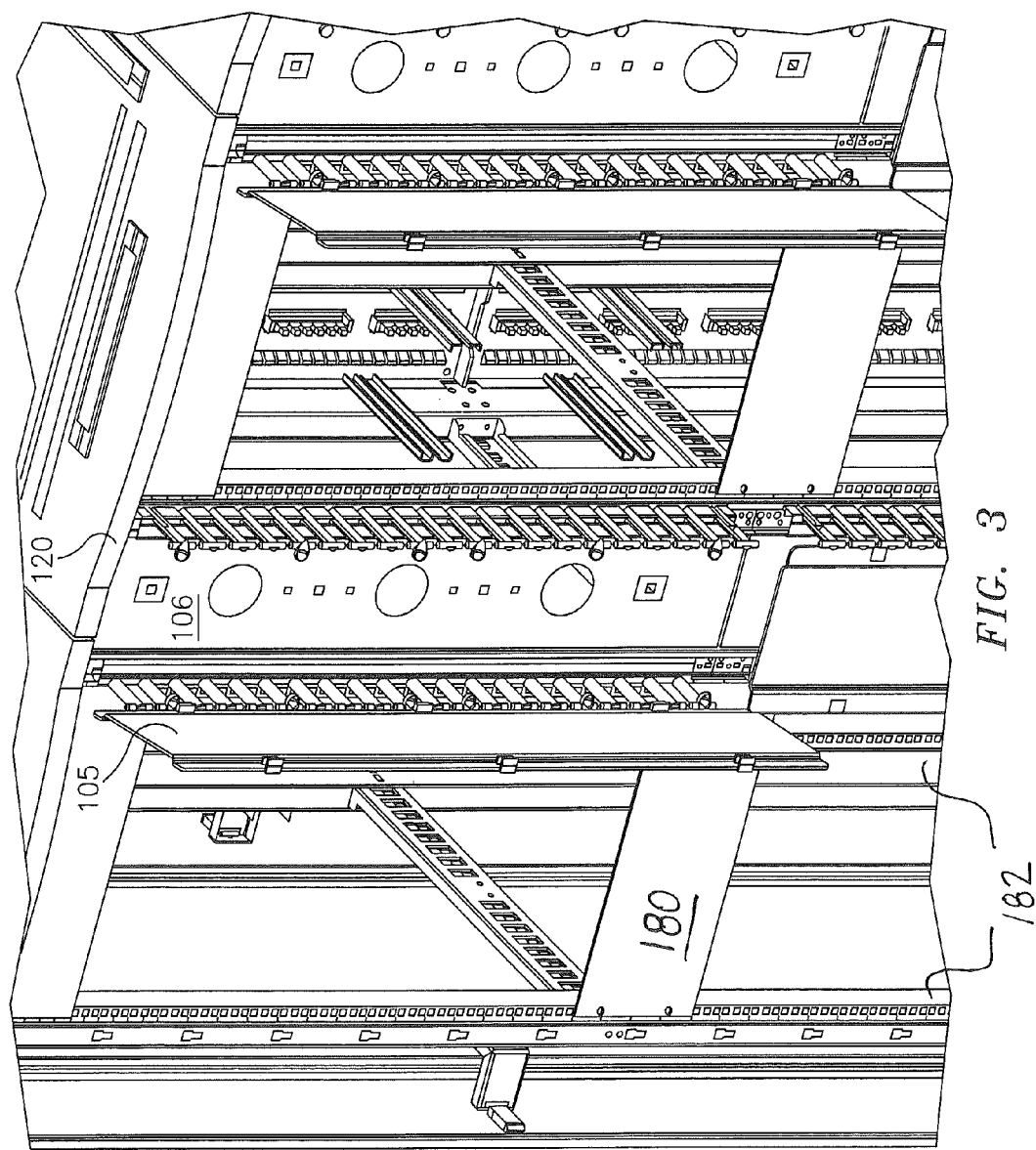
FIG. 3 is a perspective view of a vertical cable manager mounted between two cabinets.

FIG. 3 illustrates a vertical cable manager 106, with a front cover 105 in an open position. The vertical cable manager 106 may be similar to those commercially available from The Siemon Company. As with the vertical patch panel 108, the vertical cable manager 106 is recessed relative to the face 120 of the rack frame. This provides a clear and unencumbered cable zone for connecting equipment to the network. The vertical cable manager 106 is secured to both cabinets 104. Also shown in FIG. 3 is a blank panel 180 mounted horizontally between vertical mounting rails 182 in cabinets 104. As noted above, telecommunications equipment such as patch panels and active equipment are typically mounted horizontally between vertical mounting rails 182.

Vertical cable management systems have been on the market for a number of years. These cable management systems have been designed to reduce the complexity of managing the excess amount of patch cords. All cable management solutions have concentrated on the cross-connect panels where the switch and network equipment is located. Additionally these locations are also using an open lab rack solution combined with vertical managers.

Server equipment cabinets generally have their patch panels mounted in the top of the cabinet so as to maximize the space allocation for additional server equipment. Embodiments of the invention mount the connecting hardware on vertical patch panel 108 in between the cabinets in the dedicated cable zone. The benefit of the design has a number of advantages including only one length of cord is required (typically 1 m), reduced water fall effect, horizontal cables are exterior (inside the cable zone) to the equipment cabinet, utilization of space within cabinet(s) to create an effective patch zone, moves adds and changes are significantly easier, increased and more efficient air flow reducing hot spots and a fully enclosed and lockable design.

The vertical patch panel 108 enhances the design. Industry standard is that typically the patch panels (both copper and optical fiber) are located in the upper most locations within the equipment cabinet 104 and generally occupy approx 6 rack units (RU) including horizontal cable managers. The primary issue with this type of design is that different length patch cords are required to connect enterprise equipment to the network. This equipment cords may vary in length from 1 m to 5 m depending on the requirement.

It is the different length cords that contribute to the problem of "water falls" within cabinets and can be a major cause of hot spots (high localized temperature) within equipment cabinets not to mention the difficulty in effecting Moves Adds or Changes (MAC's). Embodiments of the invention solve this issue of over-length patch cords by providing the ports in a vertical manner in a vertical patch panel 108 as shown in FIG. 2, for example. Common lengths of patch cords are used to patch equipment into the network. This vertical patch panel 108 is also recessed into the equipment cabinet and can be enclosed behind a cover plate that can also be locked without fouling on either the cover plate or the lockable doors on either side. The vertical cable manager 106 may be mounted on the backside of two cabinets 104 with the vertical patch panels 108 on the front side as shown in FIG. 3. Alternatively, a vertical cable manager 106 may be mounted directly above a vertical patch panel 108.

The vertical cable manager 106 provides several benefits. In order to have a complete solution for infrastructure management it is essential to also understand and address the issues related to not just servers and storage but additionally to network equipment. Network cabinets are traditionally an area where patch cords congestion is a significant problem and this area of the solution covers the answers to this problem. The integrated vertical cable manager 106 may be implemented using an existing product made by the Siemon Company and fits very well with the rest of the solution. Because of the recessed corner rails of the equipment cabinet, free and unabated access to the vertical cable manager 106 from behind the equipment cabinet doors is achievable.

The vertical cable manager 106 provides a recessed cable zone that can be installed in between the cabinets. This enables all structured cabling to enter from in between the equipment cabinets and not from inside the cabinet. History has shown that there have been many problems when large amounts of cable are installed inside a cabinet, causing installation issues with equipment and even larger problems with poor ventilation inside. The recessed cable zone alleviates this problem.

Embodiments of the invention have a number of potential variations, however the basic and fundamental concept is still the same. Patch panels and/or network equipment including power supply and conditioning equipment mounted vertically with rear cable management in between fully enclosed equipment cabinets. The current design allows for Siemon Angled Jacks along with MPO fibre modules however a variant of this design is to form a cut out in the metal work that is that same width as a standard 19 inch mounting rail and mount the patch panels and fibre enclosures vertically in the same space. The angled jack feature may be eliminated for the copper patch panel however other equipment could be mounted into this location such as SAN Switches and the like.

Figure 4:
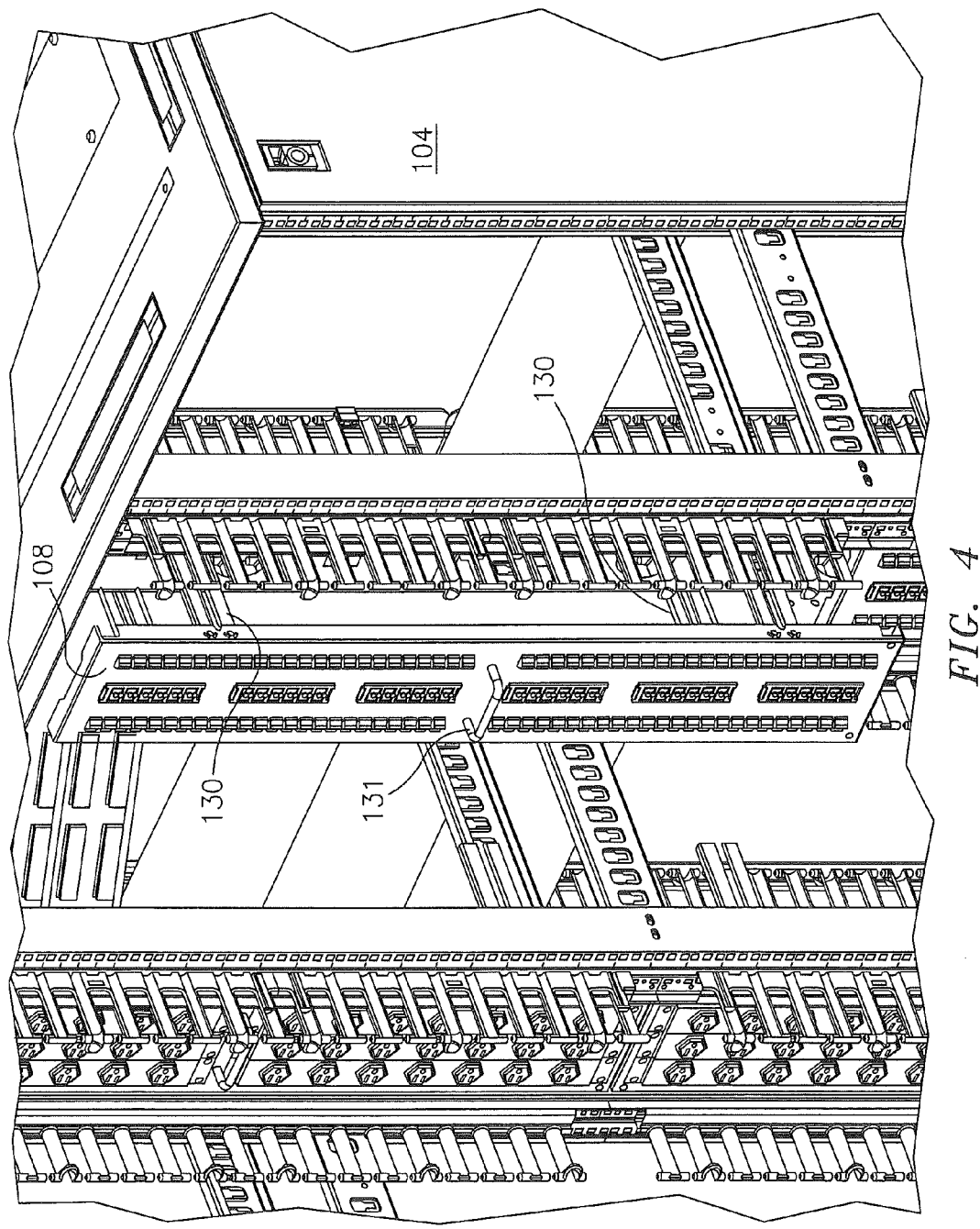
FIG. 4 illustrates a vertical patch panel positioned between cabinet areas in exemplary embodiments.

FIG. 4 illustrates a vertical patch panel 108 in an alternate embodiment. In this embodiment, the vertical patch panel 108 is mounted on rails 130 to allow the vertical patch panel 108 to slide out away from the face of the cabinets 104. This allows access to the rear side of the vertical patch panel 108 when needed. A pull 131 is provided on the front face of the vertical patch panel 108 to facilitate sliding the vertical patch panel 108 in and out.

Figure 5:
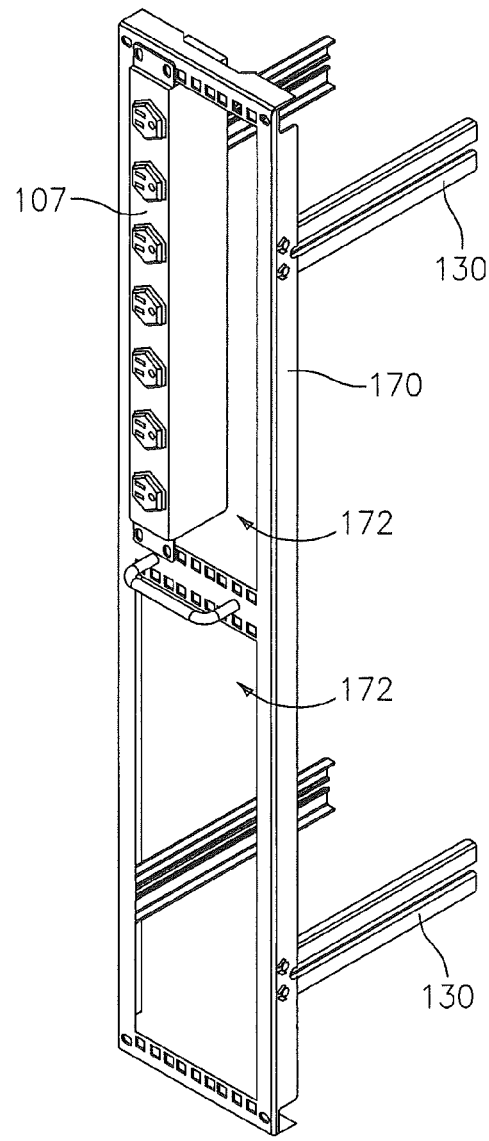
FIG. 5 illustrates a vertical support panel in exemplary embodiments.

FIG. 5 illustrates a slideable support panel 170. The slideable support panel 170 is mounted on rails 130 to allow the slideable support panel 170 to be mounted to cabinets 104 and slide in and out. The slideable support panel 170 includes openings 172 sized to fit standard rack equipment. For example, the vertical dimension of opening 172 may be 19 inches, which is a standard rack width. This allows existing components to be mounted to the slideable support panel 170 in a vertical orientation. FIG. 5 depicts a vertical power distribution panel 107. Further, existing patch panels (copper, fiber, etc.) may be mounted in opening 172. The vertical power distribution panels 107 provide access points for power to cabinet equipment.

Figure 6:
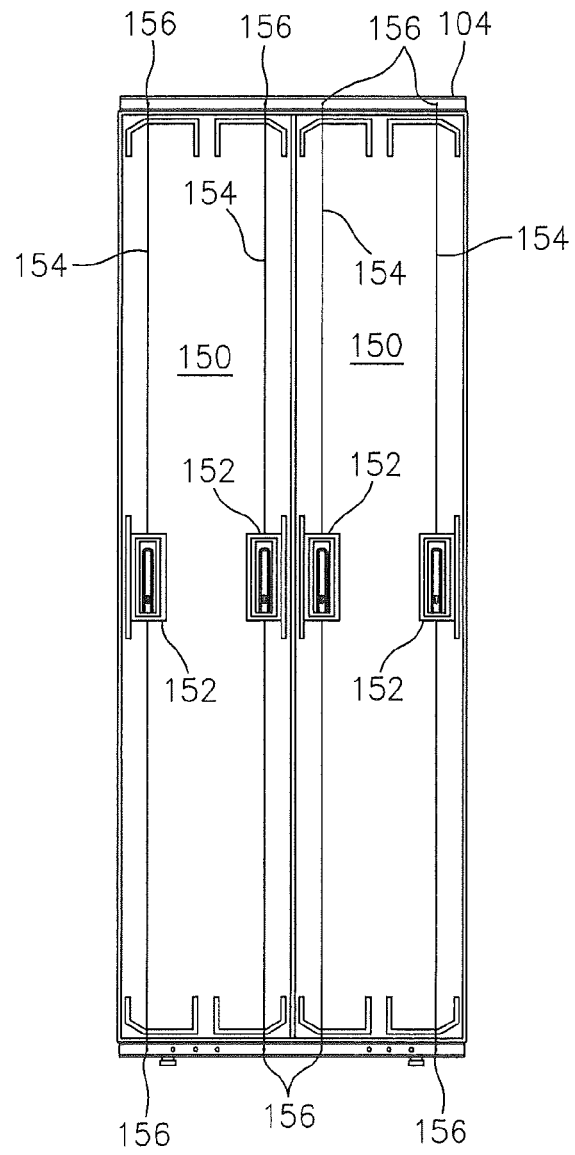
FIG. 6 illustrates rear doors on a cabinet in exemplary embodiments.

FIG. 6 illustrates a cabinet 104 having dual hinging rear doors 150. Each dual hinging rear door 150 includes two handles 152. Each handle 152 operates a latching mechanism that drives pins 154 into recesses 156 in cabinet 104. In a latched position, the pins 154 extend into recesses 156 in cabinet 104 to hinge the door 150 to the cabinet 104. When the handle 152 is turned to an unlatched position, the pins 154 are retracted from recesses 156. This allows doors 150 to open to the left side or to the right. This allows the rear doors 150 to move out of the way of vertical patch panel 108 or vertical cable manager 106 positioned between the cabinets 104.

Figure 7:
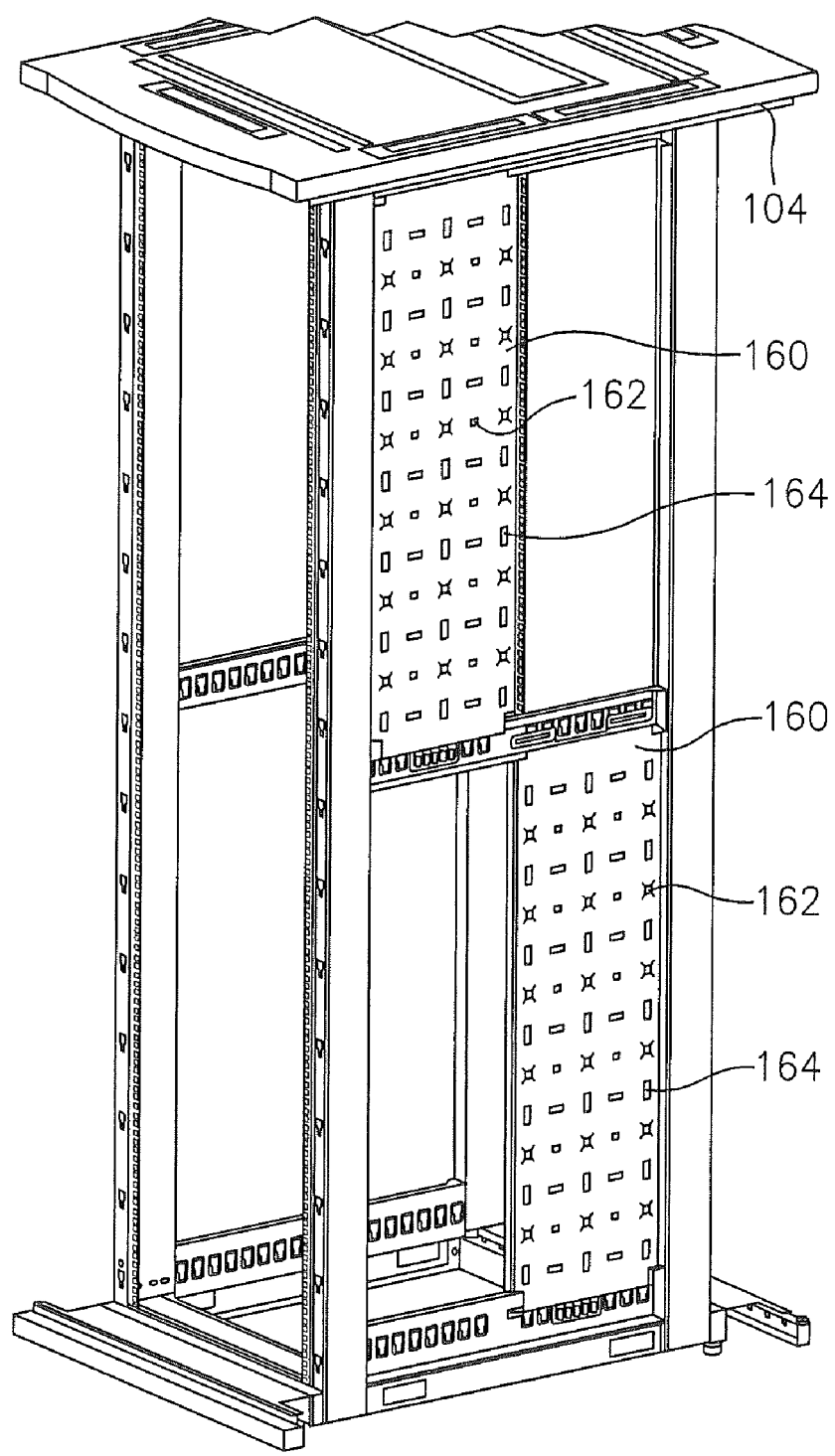
FIG. 7 illustrates cable panel trays on a side of a cabinet in exemplary embodiments.

FIG. 7 illustrates a side view of a cabinet and illustrates a number of cable tray panels 160. Cable tray panels 160 include cable manager mounts in the form of openings 162 that receive cable managers fitted with a quarter-turn fastener. Cable tray panel 160 also includes raised arch members 164 that receive cable managers having a mounting strap (e.g., Velcro band). The cable tray panels 160 provide for cable management in vertical space between cabinets as well as provide cabinet-to-cabinet isolation for improved thermal management. Completely covering cabinet sidewalls with cable tray panels 160 provides containment of heat within the cabinet. One or more cable tray panels 160 can be removed to allow for thermal exchange between adjacent cabinets. In exemplary embodiments, four cable tray panels 160 are used to cover a side of a cabinet. Any number of the cable tray panels 160 can be removed to manage thermal exchange between two adjacent cabinets.

While the invention has been described with reference to exemplary embodiments, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiments disclosed for carrying out this invention.

What is claimed is:

1. A patching system comprising:
a first patch panel cabinet having a plurality of vertical mounting rails for mounting telecommunications equipment horizontally between the vertical mounting rails, the vertical mounting rails being recessed from a front face of the first patch panel cabinet;
a second patch panel cabinet having a plurality of vertical mounting rails for mounting telecommunications equipment horizontally between the vertical mounting rails, the vertical mounting rails being recessed from a front face of the second patch panel cabinet; and
a vertical patch panel mounted between the first patch panel cabinet and the second patch panel cabinet, the vertical patch panel having telecommunications connectors mounted therein, the vertical patch panel being recessed from a front face of the first patch panel cabinet and the second patch panel cabinet.

2. The patching system of claim 1 further comprising:
a vertical cable manager mounted adjacent to one of the first patch panel cabinet and the second patch panel cabinet.

3. The patching system of claim 2 wherein:
the vertical cable manager is mounted above the vertical patch panel between the first patch panel cabinet and the second patch panel cabinet.

4. The patching system of claim 1 further comprising:
a vertical power distribution panel mounted adjacent to one of the first patch panel cabinet and the second patch panel cabinet.

5. The patching system of claim 1 wherein:
the vertical patch panel is mounted on rails, the vertical patch panel being slidable away from the vertical mounting rails and towards the front face of the first patch panel cabinet and the second patch panel cabinet to expose a rear surface of the vertical patch panel.

6. The patching system of claim 1 wherein:
the vertical patch panel having telecommunications connectors mounted therein includes telecommunications connectors mounted on a left side of the vertical patch panel and mounted on a right side of the vertical patch panel, the telecommunications connectors mounted on the left side being angled left and the telecommunications connectors mounted on the right side being angled right.

7. The patching system of claim 1 wherein:
the first patch panel cabinet is fitted with doors, each of the doors having two handles operating hinge pins, each door opening from left-to-right and from right-to-left.

8. The patching system of claim 1 wherein:
the first patch panel cabinet includes a patch panel cabinet side, the patch panel cabinet side being perpendicular to the front face of the first patch panel cabinet;
the system including at least one cable tray panel mounted to the patch panel side.

9. The patching system of claim 8 wherein:
the cable tray panel includes a plurality of cable manager mounts for mounting cable managers.

10. The patching system of claim 8 wherein:
a number of cable tray panels are mounted to the patch panel side, the number selected to control thermal management of the patch panel cabinet.

11. A patching system comprising:
a first patch panel cabinet;
a second patch panel cabinet; and
a vertical patch panel mounted between the first patch panel cabinet and the second patch panel cabinet, the vertical patch panel having telecommunications connectors mounted therein;
wherein the vertical patch panel is mounted on rails, the vertical patch panel being slidable away from the vertical mounting rails and towards the front face of the first patch panel cabinet and the second patch panel cabinet to expose a rear surface of the vertical patch panel.

\* \* \* \* \*